United States Patent
Kurosawa

(10) Patent No.: US 7,525,193 B2
(45) Date of Patent: Apr. 28, 2009

(54) SEMICONDUCTOR DEVICE AND METHOD OF MANUFACTURING THE SAME

(75) Inventor: Yasunori Kurosawa, Fujimi-cho (JP)

(73) Assignee: Seiko Epson Corporation, Tokyo (JP)

(*) Notice: Subject to any disclaimer, the term of this patent is extended or adjusted under 35 U.S.C. 154(b) by 408 days.

(21) Appl. No.: 11/128,156

(22) Filed: May 13, 2005

(65) Prior Publication Data
US 2005/0263882 A1 Dec. 1, 2005

(30) Foreign Application Priority Data
May 26, 2004 (JP) ............................ 2004-156272

(51) Int. Cl.
*H01L 23/48* (2006.01)
(52) U.S. Cl. .................. 257/737; 257/738; 257/787; 257/778; 257/781; 257/690; 257/E23.021
(58) Field of Classification Search .............. 257/737, 257/738, 780, E23.021, 787, 778, 781, 690
See application file for complete search history.

(56) References Cited

U.S. PATENT DOCUMENTS

| 6,437,434 | B1 | 8/2002 | Sugizaki | |
| 6,476,503 | B1 * | 11/2002 | Imamura et al. | 257/780 |
| 7,196,000 | B2 * | 3/2007 | Lee et al. | 438/612 |
| 2001/0027874 | A1 * | 10/2001 | Horiuchi et al. | 174/255 |

FOREIGN PATENT DOCUMENTS

| JP | A-09-064049 | 3/1997 |
| JP | A 11-204678 | 7/1999 |
| JP | A 2000-150716 | 5/2000 |
| JP | A 2002-110850 | 4/2002 |
| JP | A-2004-134480 | 4/2004 |
| JP | A-2004-140115 | 5/2004 |
| JP | A-2004-140116 | 5/2004 |

* cited by examiner

*Primary Examiner*—Lynne A. Gurley
*Assistant Examiner*—Junghwa M Im
(74) *Attorney, Agent, or Firm*—Oliff & Berridge, PLC

(57) ABSTRACT

A semiconductor device including: a semiconductor substrate having an electrode; a resin layer formed to avoid at least a part of the electrode; a land provided on the resin layer; an interconnect which electrically connects the electrode with the land; and an external terminal bonded to the land. The resin layer includes a first resin section which supports an end section of a bonding surface of the land bonded to the external terminal while avoiding a center section of the bonding surface, and a second resin section adjacent to the first resin section. The first resin section has a modulus of elasticity lower than a modulus of elasticity of the second resin section.

2 Claims, 8 Drawing Sheets

SEMICONDUCTOR DEVICE AND METHOD OF MANUFACTURING THE SAME

Japanese Patent Application No. 2004-156272, filed on May 26, 2004, is hereby incorporated by reference in its entirety.

BACKGROUND OF THE INVENTION

The present invention relates to a semiconductor device and a method of manufacturing the same.

A chip scale/size package (CSP) has attracted attention as a semiconductor package. A technology for manufacturing a package at a wafer level (wafer-level packaging) has been developed. Since a package (wafer-level CSP, for example) manufactured by using this method has outer dimensions equal to the dimensions of the semiconductor chip, such a package differs in structure from a conventional semiconductor package. However, such a package is required to have reliability equal to or higher than that of a conventional semiconductor package.

BRIEF SUMMARY OF THE INVENTION

According to a first aspect of the present invention, there is provided a semiconductor device, comprising:

a semiconductor substrate having an integrated circuit and an electrode;

a resin layer formed on the semiconductor substrate to avoid at least a part of the electrode;

a land provided on the resin layer;

an interconnect which electrically connects the electrode with the land; and an external terminal bonded to the land;

wherein the resin layer includes a first resin section which supports an end section of a bonding surface of the land bonded to the external terminal while avoiding a center section of the bonding surface, and a second resin section adjacent to the first resin section; and wherein the first resin section has a modulus of elasticity lower than a modulus of elasticity of the second resin section.

According to a second aspect of the present invention, there is provided a method of manufacturing a semiconductor device, the method comprising:

forming a resin layer on a semiconductor substrate having an integrated circuit and an electrode, the resin layer being formed to avoid at least a part of the electrode;

forming a land on the resin layer and forming an interconnect which electrically connects the electrode with the land; and forming an external terminal bonded to the land;

wherein the resin layer is formed to include a first resin section for supporting an end section of a bonding surface of the land bonded to the external terminal while avoiding a center section of the bonding surface, and a second resin section adjacent to the first resin section; and wherein the first resin section is formed to have a modulus of elasticity lower than a modulus of elasticity of the second resin section.

DETAILED DESCRIPTION OF THE EMBODIMENTS

Figure 1:
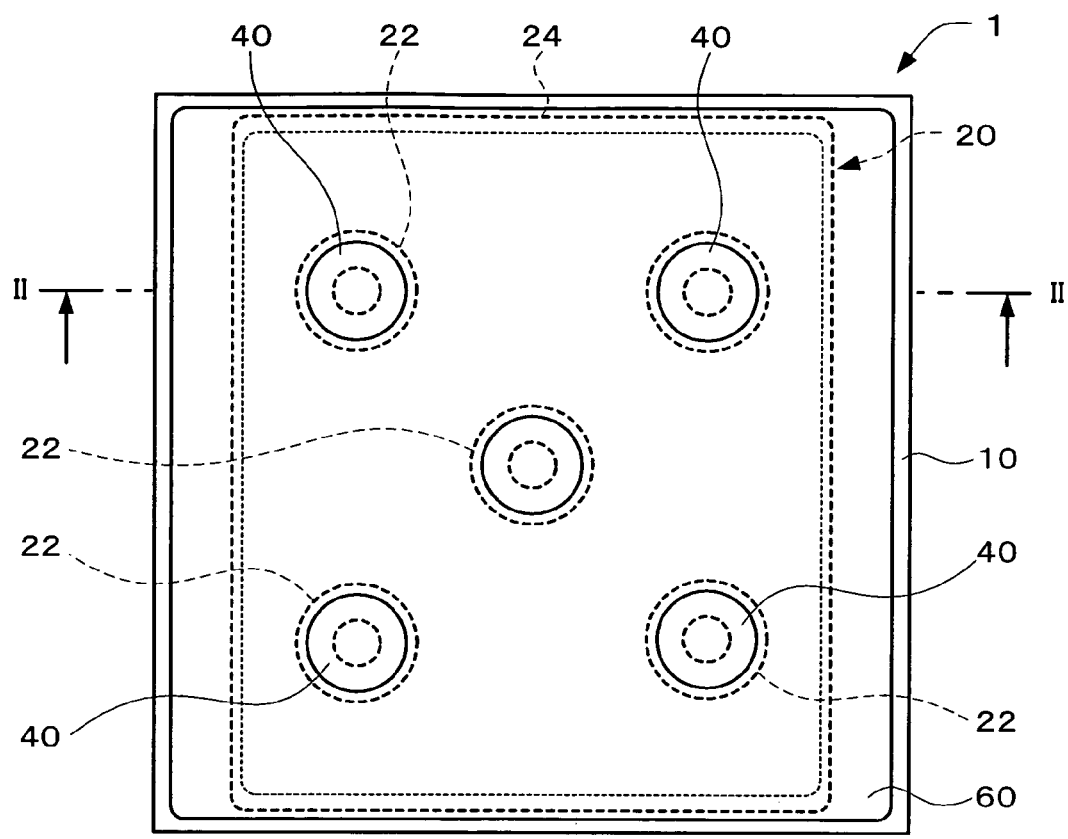
FIG. 1 is illustrative of a semiconductor device according to a first embodiment of the present invention.

The present invention may provide a highly reliable semiconductor device and a method of manufacturing the semiconductor device.

(1) According to one embodiment of the present invention, there is provided a semiconductor device, comprising:

a semiconductor substrate having an integrated circuit and an electrode;

a resin layer formed on the semiconductor substrate to avoid at least a part of the electrode;

a land provided on the resin layer;

an interconnect which electrically connects the electrode with the land; and an external terminal bonded to the land;

wherein the resin layer includes a first resin section which supports an end section of a bonding surface of the land bonded to the external terminal while avoiding a center section of the bonding surface, and a second resin section adjacent to the first resin section; and wherein the first resin section has a modulus of elasticity lower than a modulus of elasticity of the second resin section.

In this embodiment, the resin layer includes two resin sections having different moduli of elasticity. The end section of the bonding surface of the land bonded to the external terminal is supported by the resin section having a lower modulus of elasticity (first resin section). Therefore, a highly reliable semiconductor device can be provided in which separation between the land and the external terminal can be prevented by allowing the land to be deformed even when a large amount of force is applied to the interface between the land and the external terminal.

(2) In this semiconductor device, the first resin section may be formed under an entire peripheral section of the bonding surface which encloses the center section.

(3) In this semiconductor device, the first resin section may be formed under a peripheral section of the bonding surface which encloses the center section while avoiding a position under a connection section of the land connected with the interconnect; and a part of the second resin section may be formed under the connection section of the land connected with the interconnect.

(4) The semiconductor device may comprise a plurality of the lands, wherein the end section of the bonding surface of each of the lands may include a first end section near a center of a region which encloses the lands, and a second end section which faces a direction toward outside of the region; and wherein the first resin section may be formed under the second end section while avoiding a position under the first end section.

(5) In this semiconductor device, a side surface of the first resin section may be inclined so that an upper surface of the first resin section is larger than a bottom surface of the first resin section.

(6) In this semiconductor device, a side surface of the first resin section may be inclined so that an upper surface of the first resin section is smaller than a bottom surface of the first resin section.

(7) In this semiconductor device, the first resin section may be covered with the second resin section so that the land is not in contact with the first resin section.

(8) In this semiconductor device, the land may be formed to be in contact with the first resin section.

(9) According to one embodiment of the present invention, there is provided a method of manufacturing a semiconductor device, the method comprising:

forming a resin layer on a semiconductor substrate having an integrated circuit and an electrode, the resin layer being formed to avoid at least a part of the electrode;

forming a land on the resin layer and forming an interconnect which electrically connects the electrode with the land; and forming an external terminal bonded to the land;

wherein the resin layer is formed to include a first resin section for supporting an end section of a bonding surface of the land bonded to the external terminal while avoiding a center section of the bonding surface, and a second resin section adjacent to the first resin section; and wherein the first resin section is formed to have a modulus of elasticity lower than a modulus of elasticity of the second resin section.

In this embodiment, the first resin section is formed to support the end section of the bonding surface of the land bonded to the external terminal. Therefore, a highly reliable semiconductor device can be manufactured in which separation between the land and the external terminal can be prevented by allowing the land to be deformed even when a large amount of force is applied to the interface between the land and the external terminal.

The embodiments of the present invention will be described below with reference to the drawings. Note that the present invention is not limited to the following embodiments.

First Embodiment

Figure 2:
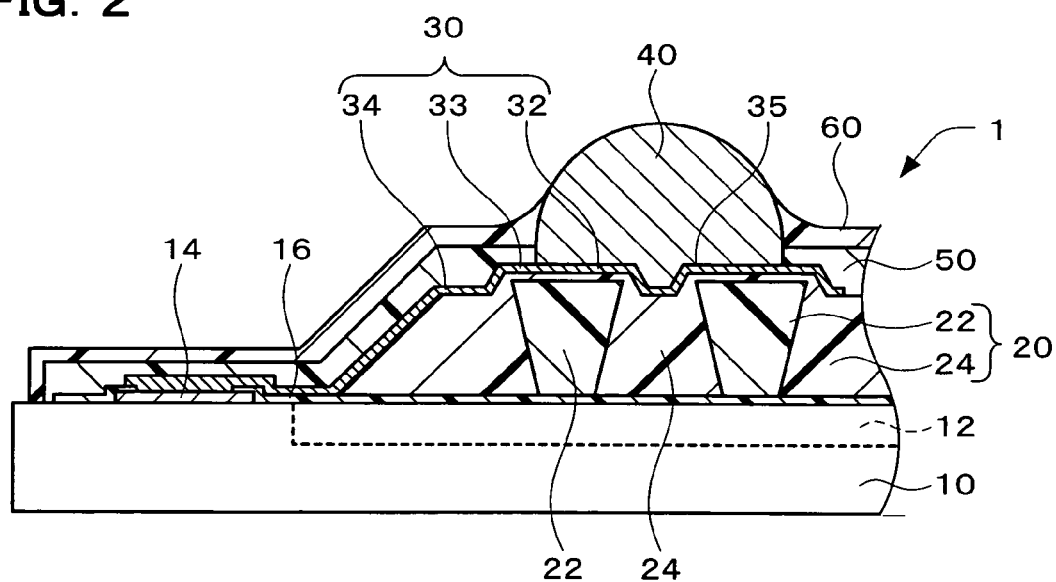
FIG. 2 is illustrative of a semiconductor device according to the first embodiment of the present invention.

FIGS. 1 and 2 are illustrative of a semiconductor device according to a first embodiment to which the present invention is applied. FIG. 1 is a plan view of a semiconductor device 1, and FIG. 2 is a partial enlarged cross-sectional view along the line II-II shown in FIG. 1.

The semiconductor device according to this embodiment includes a semiconductor substrate 10. The semiconductor substrate 10 may be a silicon substrate, for example. The semiconductor substrate 10 may be a semiconductor chip (see FIG. 1). The planar shape of the semiconductor chip is generally quadrilateral. However, the planar shape of the semiconductor chip is not limited thereto. The semiconductor substrate may be a semiconductor wafer (not shown). The semiconductor substrate 10 includes one or a plurality of integrated circuits 12 (one integrated circuit 12 for a semiconductor chip and a plurality of integrated circuits 12 for a semiconductor wafer) (see FIG. 2). The configuration of the integrated circuit 12 is not particularly limited. For example, the integrated circuit 12 may include an active element such as a transistor and a passive element such as a resistor, a coil, and a capacitor. An electrode 14 is formed on the semiconductor substrate 10. The electrode 14 may be electrically connected with the inside of the semiconductor substrate 10. The electrode 14 may be electrically connected with the integrated circuit 12. An electrode which is not electrically connected with the integrated circuit 12 may also be the electrode 14. The electrodes 14 may be arranged along two parallel sides of the semiconductor substrate 10, or may be arranged along the four sides of the semiconductor substrate 10. A passivation film 16 may be formed on the surface of the semiconductor substrate 10 (surface on which the electrode 14 is formed) while avoiding at least a part of the electrode 14. The passivation film 16 is an electrical insulating film. The passivation film 16 may be formed of SiN, $SiO_2$, a polyimide resin, or the like.

As shown in FIGS. 1 and 2, the semiconductor device in this embodiment includes a resin layer 20. The resin layer 20 is formed on the semiconductor substrate 10. The resin layer 20 is formed to avoid the electrode 14. As shown in FIGS. 1 and 2, the resin layer 20 may be formed in the center section of the semiconductor substrate 10 while avoiding the end section of the semiconductor substrate 10. The resin layer 20 may have a stress reducing function. The resin layer 20 includes a first resin section 22 and a second resin section 24 adjacent to the first resin section 22. The first and second resin sections 22 and 24 may be collectively called the resin layer 20. The first and second resin sections 22 and 24 may be formed of a polyimide resin, a silicone-modified polyimide resin, an epoxy resin, a silicone-modified epoxy resin, benzocyclobutene (BCB), polybenzoxazole (PBO), or the like. The first resin section 22 is formed to have a modulus of elasticity lower than the modulus of elasticity of the second resin section 24. In other words, the first resin section 22 is formed to be softer than the second resin section 24. Specifically, the first resin section 22 can be elastically deformed by a smaller force in comparison with the second resin section 24. A difference in modulus of elasticity may be created between the first and second resin sections 22 and 24 by forming the first and second resin sections 22 and 24 using different materials. In the case of forming the second resin section 24 using a polyimide resin, a difference in modulus of elasticity may be created between the first and second resin sections 22 and 24 by forming the first resin section 22 using a silicone-modified epoxy resin, benzocyclobutene (BCB), polybenzoxazole (PBO), or the like. In the case of forming the second resin section 24 using an epoxy resin, a difference in modulus of elasticity may be created between the first and second resin sections 22 and 24 by forming the first resin section 22 using a polyimide resin. As shown in FIGS. 1 and 2, in the semiconductor device according to this embodiment, the first resin section 22 is formed to support the end section of a bonding surface 35 of a land 32 bonded to an external terminal 40 as described later while avoiding the center section of the bonding surface 35. The first resin section 22 may be formed under the entire peripheral section of the bonding surface 35 which encloses the center section (see FIG. 1). The second resin section 24 is formed adjacent to the first resin section 22. In the case where the planar shape of the bonding surface 35 is circular, the first resin section 22 may be formed in the shape of a circular ring (see FIG. 1). The second resin section 24 may be formed to fill the inside of the first resin section 22. Specifically, the center section of the bonding surface 35 may be supported by the second resin section 24 (see FIG. 2). The side surface of the first resin section 22 may be inclined so that the upper surface is larger than the bottom surface (see FIG. 2). As shown in FIG. 2, the second resin section 24 may be formed to cover the first resin section 22.

As shown in FIG. 2, the semiconductor device in this embodiment includes the land 32. The land 32 is formed on the resin layer 20. The planar shape of the land 32 is not particularly limited. For example, the planar shape of the land 32 may be circular. The external terminal 40 as described later is bonded to the land 32. The surface of the land 32 bonded to the external terminal 40 may be called the bonding surface 35 (see FIG. 2). The bonding surface 35 may be the section of the land 32 exposed from the opening in a resist layer 50 (see FIG. 2). The semiconductor device also includes an interconnect 34 which electrically connects the electrode 14 with the land 32. The interconnect 34 may be formed to pass over the second resin section 24. The land 32 and the interconnect 34 may be integrally formed. In this case, the land 32 and the interconnect 34 may be collectively called an interconnect pattern 30. The land 32 may include a connection section 33 with the interconnect 34. The land 32 is formed so that the end section of the bonding surface 35 is supported by the first resin section 22. As shown in FIG. 2, the land 32 may be formed so that the land 32 is not in contact with the first resin section 22. Specifically, the second resin section 24 may be formed to cover the first resin section 22, and the land 32 may be formed on the second resin section 24.

As shown in FIG. 2, the semiconductor device in this embodiment includes the external terminal 40. The external terminal 40 is bonded to the land 32. The external terminal 40 may be electrically connected with the electrode 14 through the interconnect pattern 30. The external terminal 40 is formed of a metal (alloy, for example) which is caused to melt and provides electrical connection (solder, for example). The external terminal 40 may be formed of soft solder or hard solder. The external terminal 40 may be spherical, and may be a solder ball, for example.

As shown in FIG. 2, the semiconductor device in this embodiment may include the resist layer 50. The resist layer 50 covers at least a part of the interconnect pattern 30. Oxidation and corrosion of the interconnect pattern 30 can be prevented by covering the entire area of the interconnect pattern 30 excluding the area on which the external terminal 40 is formed (bonding surface 35 of the land 32) with the resist layer 50, whereby an electrical failure can be prevented. The resist layer 50 may be formed to avoid at least the center section of the land 32 of the interconnect pattern 30. The resist layer 50 may cover the peripheral section of the land 32.

The semiconductor device in this embodiment may include a coating layer 60. The coating layer 60 may be formed on the resist layer 50. The coating layer 60 may be formed to cover the base section (bottom section) of the external terminal 40. The coating layer 60 may include a section formed on the resist layer 50, and a section which rises from the section formed on the resist layer 50 and covers the base section of the external terminal 40 (see FIG. 2). The periphery of the base section of the external terminal 40 can be reinforced by the coating layer 60.

Figure 3:
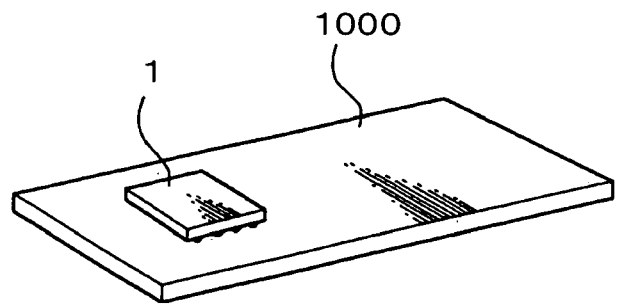
FIG. 3 shows a circuit board on which the semiconductor device according to the first embodiment of the present invention is mounted.
Figure 4:
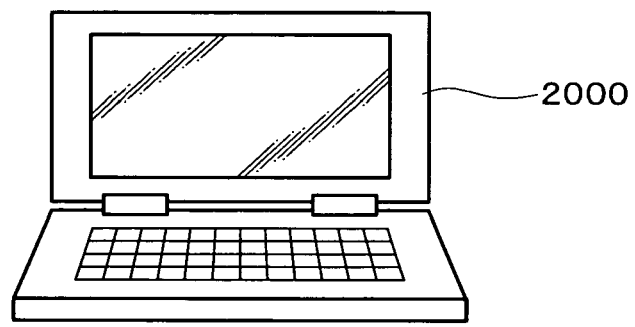
FIG. 4 shows an electronic instrument including a semiconductor device according to an embodiment of the present invention.
Figure 5:
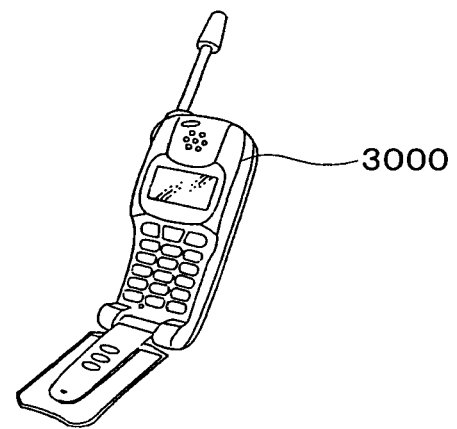
FIG. 5 shows an electronic instrument including a semiconductor device according to an embodiment of the present invention.

The semiconductor device 1 in this embodiment may be configured as described above. In the semiconductor device 1, the first resin section 22 is formed to support the end section of the bonding surface 35 while avoiding the center section of the bonding surface 35 as described above. The first resin section 22 is formed to have a modulus of elasticity lower than the modulus of elasticity of the second resin section 24. In general, stress may occur between the external terminal 40 and the land 32 after mounting the semiconductor device on a motherboard or the like due to the difference in coefficient of thermal expansion between the semiconductor chip and the motherboard or the like. The first resin section 22 is easily elastically deformed in comparison with the second resin section 24. Therefore, since the bonding surface 35 is easily deformed to follow the external terminal 40, the force applied to the interface between the land 32 and the external terminal 40 can be reduced. Specifically, the stress occurring between the land 32 and the external terminal 40 can be reduced by the resin layer 20 (first resin section 22). The resin layer 20 includes the second resin section 24. Since the second resin section 24 has a modulus of elasticity higher than the modulus of elasticity of the first resin section 22, the second resin section 24 can be prevented from being deformed to a large extent even when the land 32 causes the first resin section 22 to be elastically deformed. The interconnect 34 is formed to pass over the second resin section 24. Therefore, the interconnect 34 does not easily break. Therefore, a semiconductor device with high reliability against stress can be provided. In the case where the semiconductor substrate 10 is a semiconductor chip, the semiconductor device 1 may be classified as a CSP due to a package size almost equal to the size of the semiconductor chip. Or, the semiconductor device 1 may be classified as a flip chip provided with a stress reducing function. FIG. 3 shows a circuit board 1000 on which the semiconductor device 1 is mounted. FIGS. 4 and 5 respectively show a notebook-type personal computer 2000 and a portable telephone 3000 as electronic instruments including the semiconductor device according to the embodiment to which the present invention is applied.

Figure 6:
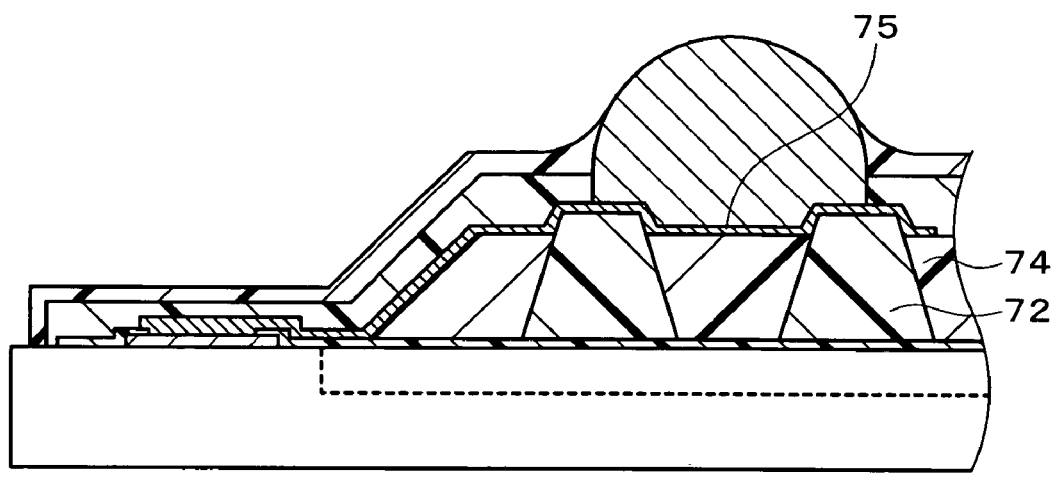
FIG. 6 is illustrative of a semiconductor device according to a modification of the first embodiment of the present invention.

The structure of the semiconductor device according to this embodiment is not limited to the above-described structure. As shown in FIG. 6, the semiconductor device may include a first resin section 72 of which the side surface is inclined so that the upper surface is smaller than the bottom surface, for example. The semiconductor device may include a second resin section 74 which exposes the upper surface of the first resin section 72. As shown in FIG. 6, a land 75 may be formed to be in contact with the first resin section 72.

Figure 7:
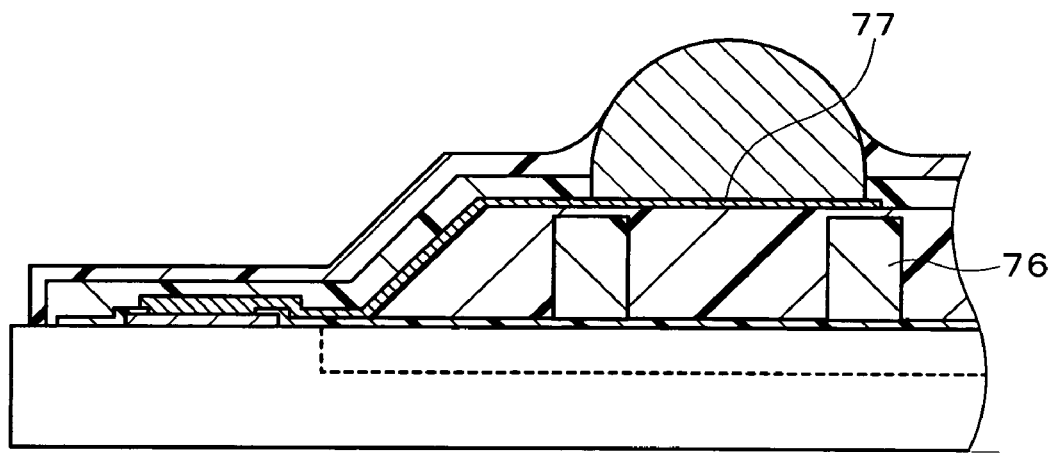
FIG. 7 is illustrative of a semiconductor device according to a modification of the first embodiment of the present invention.

As shown in FIG. 7, the semiconductor device may include a first resin section 76 formed so that the upper surface and the bottom surface are equal in size. The external shape of the top surface of the first resin section 76 may be larger than the external shape of a land 77. Specifically, as shown in FIG. 7, the first resin section 76 may be formed to support the end section of the land 77.

In these modifications, the description of the above-described embodiment may be applied to features other than the features described above in detail, and the same effect can be achieved. A semiconductor device may be configured by combining the above-described features.

A method of manufacturing the semiconductor device according to this embodiment is described below. FIGS. 8A to 11 are illustrative of a method of manufacturing the semiconductor device according to the first embodiment to which the present invention is applied.

Figure 8A:
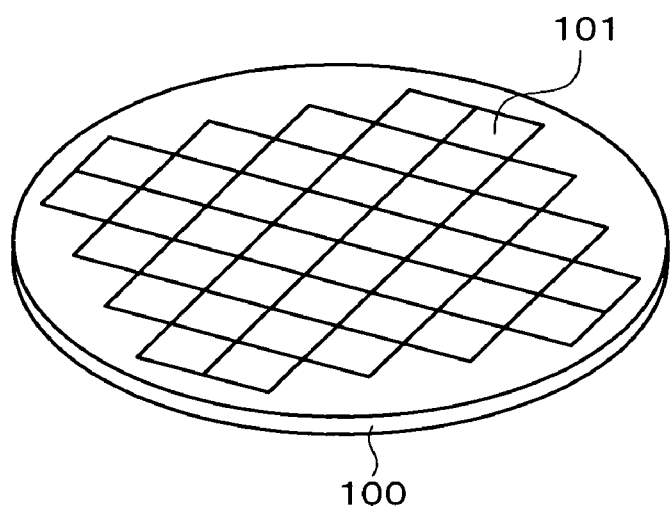
FIGS. 8A and 8B are illustrative of a method of manufacturing a semiconductor device according to the first embodiment of the present invention.
Figure 8B:
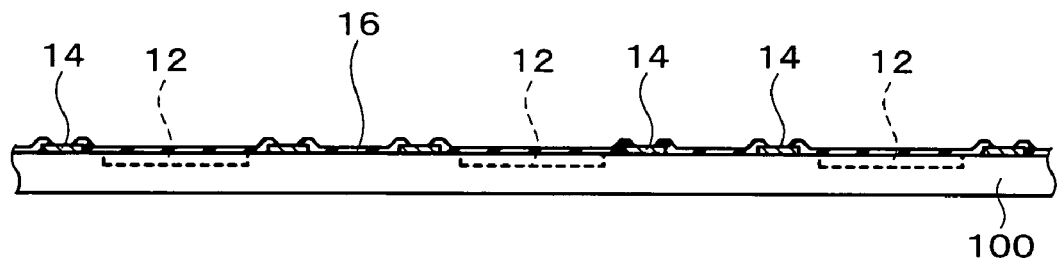

The method of manufacturing the semiconductor device in this embodiment includes forming the resin layer 20 on a semiconductor substrate 100. The resin layer 20 is formed to include the first resin section 22 for supporting the end section of the bonding surface 35 of the land 32 bonded to the external terminal 40 while avoiding the center section of the bonding surface 35, and the second resin section 24 adjacent to the first resin section 22. The first resin section 22 is formed to have a modulus of elasticity lower than the modulus of elasticity of the second resin section 24. This step is described below. As shown in FIGS. 8A and 8B, this step includes providing the semiconductor substrate 100. FIG. 8A is a diagram showing the entire shape of the semiconductor substrate 100, and FIG. 8B is a cross-sectional diagram of the semiconductor substrate 100. As shown in FIG. 8A, the semiconductor substrate 100 may be a semiconductor wafer. As shown in FIG. 8A, the semiconductor substrate 100 includes regions 101 which make up a plurality of semiconductor devices. As shown in FIG. 8B, a plurality of integrated circuits 12 are formed on the semiconductor substrate 100. The integrated circuit 12 may be formed in units of the regions 101 which make up the semiconductor devices. As shown in FIG. 8B, the semiconductor substrate 100 includes a plurality of electrodes 14.

Figure 9A:
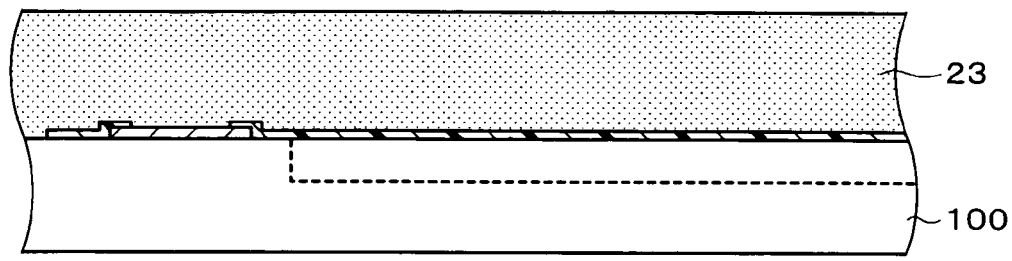
FIGS. 9A to 9C are illustrative of a method of manufacturing a semiconductor device according to the first embodiment of the present invention.
Figure 9B:
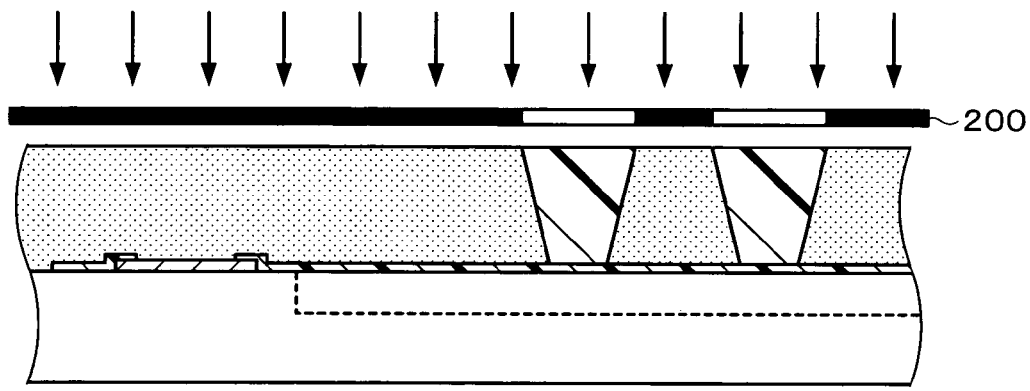
Figure 9C:
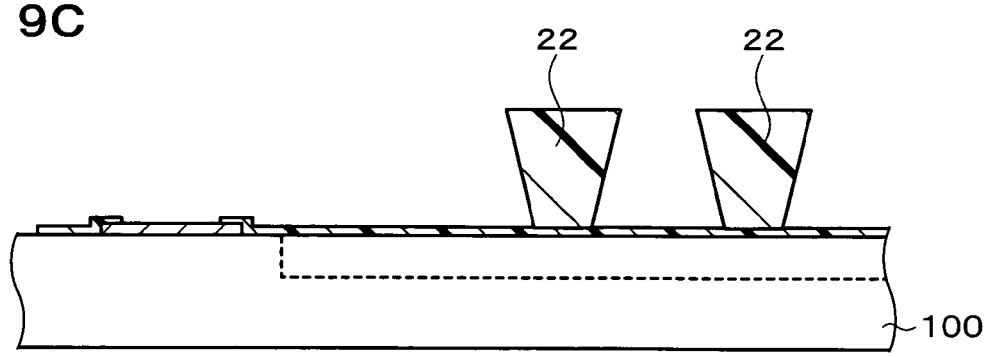

This step may include forming the first resin section 22 on the semiconductor substrate 100. FIGS. 9A to 9C are illustrative of the step of forming the first resin section 22 on the semiconductor substrate 100. As shown in FIG. 9A, a material 23 for the first resin section 22 may be provided on the semiconductor substrate 100. As shown in FIG. 9B, a mask 200 is disposed above the material 23, and energy is applied to the material 23. The mask 200 has a structure which allows the energy to partially pass therethrough. As shown in FIG. 9B, the mask 200 may have a structure which allows the energy to pass therethrough above the formation region of the first resin section 22. A part of the material 23 may be cured by applying the energy (see FIG. 9B). As shown in FIG. 9C, the first resin section 22 may be formed by removing the material 23. The material 23 may have such properties that the material 23 is cured (solubility in a developer is decreased) by application of energy. In this case, the material 23 is a negative-tone material. The first resin section 22 may be formed so that the side surface is inclined such that the upper surface is larger than the bottom surface as shown in FIG. 9C by utilizing the negative-tone material 23. Or, the first resin section 22 may be formed so that the side surface is inclined such that the upper surface is smaller than the bottom surface by utilizing a positive-tone material (see FIG. 6). The energy may be selected depending on the material 23. In the case where the material 23 is a photosensitive material, light may be applied as the energy.

Figure 10A:
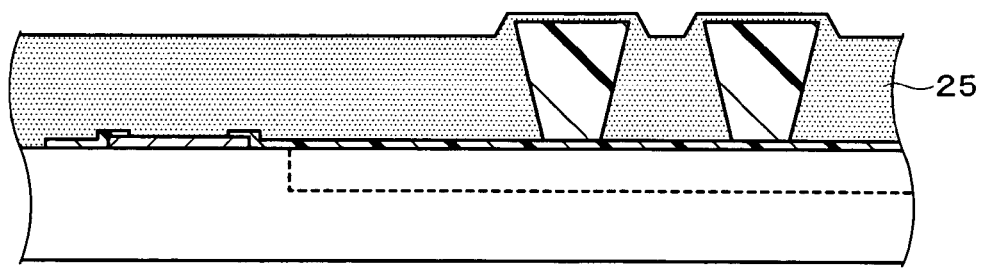
FIGS. 10A to 10C are illustrative of a method of manufacturing a semiconductor device according to the first embodiment of the present invention.
Figure 10B:
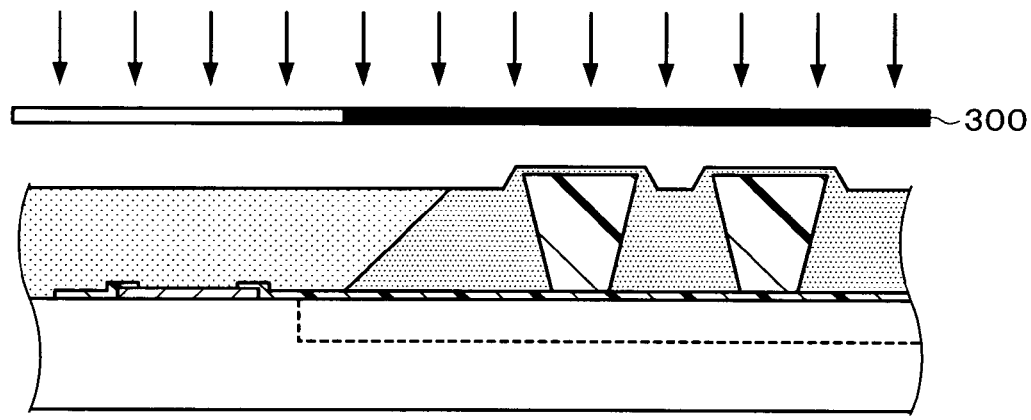
Figure 10C:
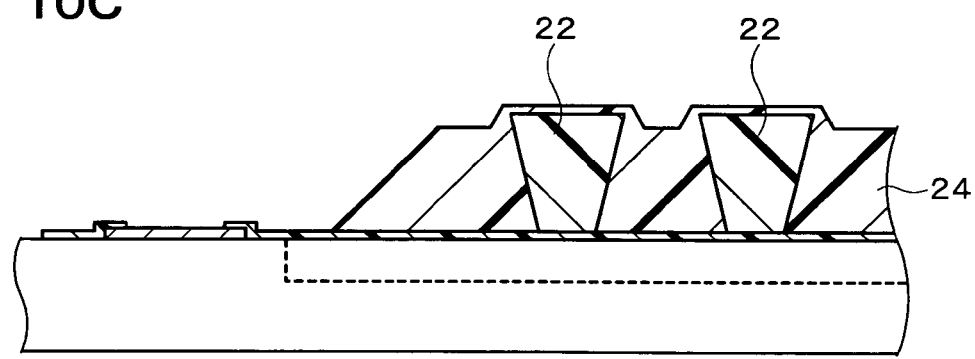

This step may include forming the second resin section 24 on the semiconductor substrate 100. FIGS. 10A to 10C are illustrative of the step of forming the second resin section 24 on the semiconductor substrate 100. As shown in FIG. 10A, a material 25 for the second resin section 24 may be provided on the semiconductor substrate 100. As shown in FIG. 10B, a mask 300 is disposed above the material 25, and energy is applied to the material 25. The mask 300 has a structure which allows the energy to partially pass therethrough. As the material 25, a material having such properties that the solubility in a developer is increased by application of energy may be used. In this case, the material 25 is a positive-tone material. The region in which the energy is applied may be removed by a development step, and the material 25 may be polymerized to form the second resin section 24 as shown in FIG. 10C. As shown in FIG. 10A, the material 25 may be formed to cover the first resin section 22. As shown in FIG. 10C, the second resin section 24 may be formed to cover the first resin section 22.

The first resin section 22 and the second resin section 24 may be formed by these steps. The first and second resin sections 22 and 24 may be collectively called the resin layer 20. In the method of manufacturing the semiconductor device according to this embodiment, the first resin section 22 is formed to have a modulus of elasticity lower than the modulus of elasticity of the second resin section 24. The first resin section 22 may be formed to have a modulus of elasticity lower than the modulus of elasticity of the second resin section 24 by forming the first and second resin sections 22 and 24 using different materials. The moduli of elasticity of the first and second resin sections 22 and 24 may be changed by changing the polymerization time of the resin material or the amount of energy used for polymerization. Specifically, the moduli of elasticity of the first and second resin sections 22 and 24 may be changed by utilizing the difference in the degree of polymerization. The resin layer 20 is formed to avoid the electrode 14 (see FIG. 11).

Figure 11:
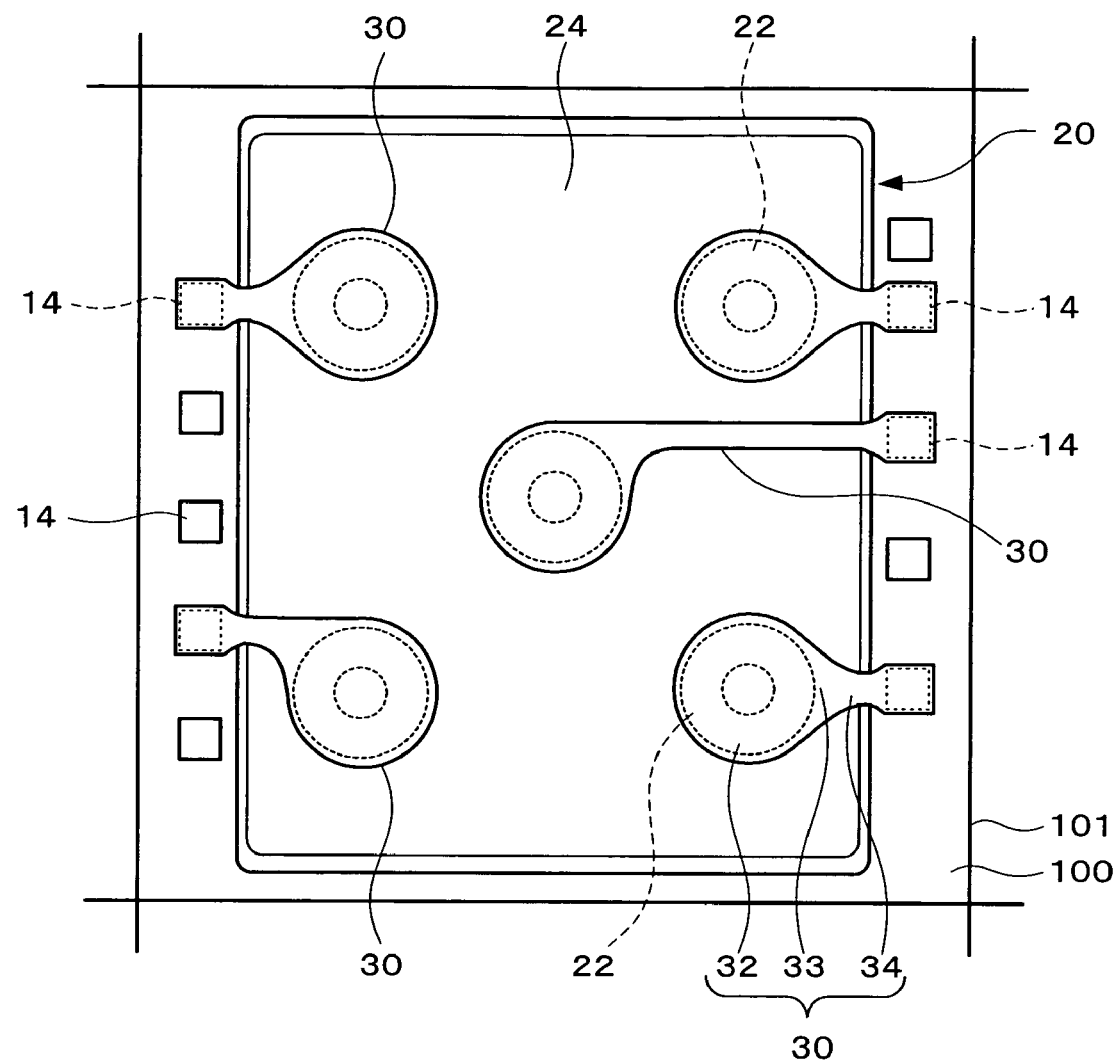
FIG. 11 is illustrative of a method of manufacturing a semiconductor device according to the first embodiment of the present invention.

The method of manufacturing the semiconductor device in this embodiment includes forming the interconnect pattern 30, as shown in FIG. 11. The interconnect pattern 30 is formed to include the land 32 disposed on the resin layer 20 and the interconnect 34 which electrically connects the electrode 14 with the land 32. The interconnect pattern 30 may be formed so that the land 32 includes the connection section 33 with the interconnect 34. The method for forming the interconnect pattern 30 is not particularly limited, and a conventional method may be applied. For example, the interconnect pattern 30 may be formed by sputtering, or an additive method of forming the interconnect pattern 30 by electroless plating may be applied. The interconnect pattern 30 may be formed by discharging a solvent containing conductive fine particles. In this embodiment, as shown in FIG. 11, the interconnect pattern 30 is formed so that the land 32 overlaps the first resin section 22. As shown in FIG. 11, the interconnect pattern 30 is formed so that the land 32 is larger than the external shape of the first resin section 22. Or, the interconnect pattern 30 may be formed so that the land 32 is smaller than the external shape of the top surface of the first resin section 22 (see FIG. 7).

The method of manufacturing the semiconductor device in this embodiment includes forming the external terminal 40 bonded to the land 32. For example, the resist layer 50 having an opening which exposes the center section of the land 32 of the interconnect pattern 30 may be formed, and the external terminal 40 may be formed to overlap the opening. The external terminal 40 may be formed so that the end section of the bonding surface 35 of the land 32 bonded to the external terminal 40 overlaps the first resin section 22 (upper surface of the first resin section 22). The size and the position of the bonding surface 35 may be adjusted by adjusting the size of the opening in the resist layer 50. The semiconductor device 1 may be manufactured by thereafter performing a step of forming the coating layer 60, a step of cutting the semiconductor substrate 100, an inspection step, and the like (see FIGS. 1 and 2).

Second Embodiment

Figure 12:
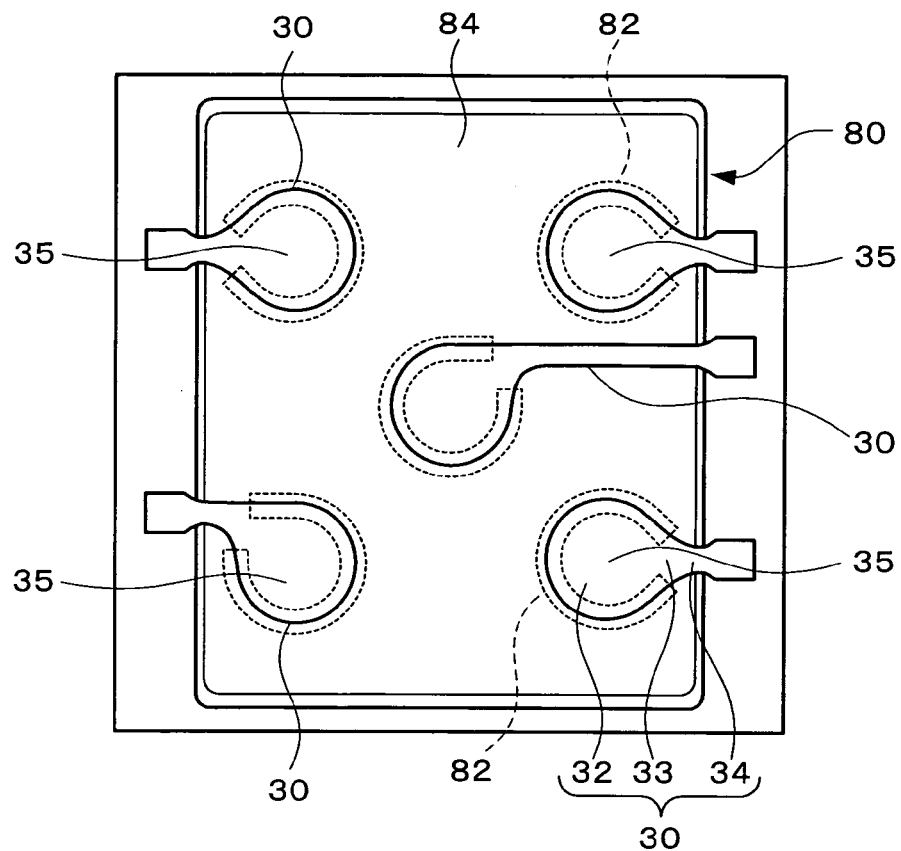
FIG. 12 is illustrative of a semiconductor device according to a second embodiment of the present invention.

FIG. 12 is illustrative of a semiconductor device according to a second embodiment to which the present invention is applied. The semiconductor device in this embodiment includes a resin layer 80. The resin layer 80 includes a first resin section 82 and a second resin section 84. The first resin section 82 is formed to have a modulus of elasticity lower than the modulus of elasticity of the second resin section 84. As shown in FIG. 12, the first resin section 82 is formed under the peripheral section of the bonding surface 35 which encloses the center section while avoiding the position under the connection section 33 of the land 32 connected with the interconnect 34. As shown in FIG. 12, the second resin section 84 is formed under the connection section 33. In other words, a part of the second resin section 84 is formed under the connection section 33. According to this configuration, since the connection section 33 is supported by the second resin section 84, the connection section 33 can be prevented from being deformed to a large extent even when external force is applied to the land 32. Therefore, a highly reliable semiconductor device in which the interconnect pattern 30 rarely breaks can be provided.

Third Embodiment

Figure 13:
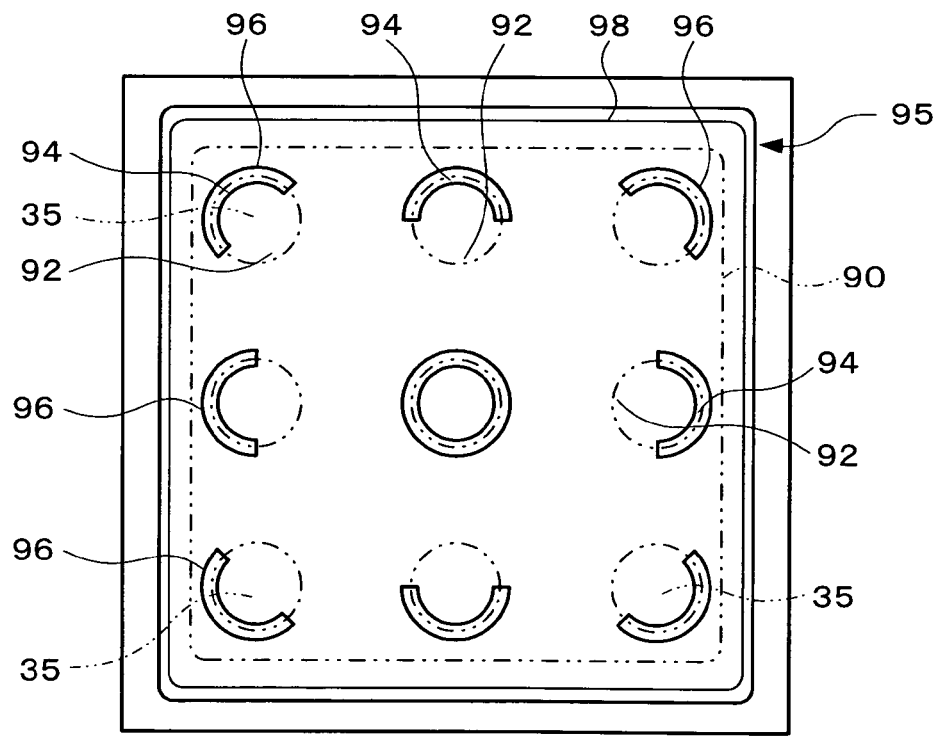
FIG. 13 is illustrative of a semiconductor device according to a third embodiment of the present invention.

FIG. 13 is illustrative of a semiconductor device according to a third embodiment to which the present invention is applied. In FIG. 13, the interconnect pattern is omitted and the bonding surface 35 of the land bonded to the external terminal is shown for convenience of illustration. A plurality of lands are provided in the semiconductor device according to this embodiment (not shown). The end section of the bonding surface 35 of each land bonded to the external terminal includes a first end section 92 and a second end section 94. The first end section 92 is the end section of the bonding surface 35 near the center of a region 90 which encloses the lands. The second end section 94 is the end section of the bonding surface 35 which faces the direction toward the outside of the region 90 which encloses the lands.

The semiconductor device in this embodiment includes a resin layer 95. The resin layer 95 includes a first resin section 96 and a second resin section 98. The first resin section 96 is formed to have a modulus of elasticity lower than the modulus of elasticity of the second resin section 98. In the semiconductor device in this embodiment, the first resin section 96 is formed under the second end section 94 while avoiding the position under the first end section 92. Specifically, the second end section 94 of the bonding surface 35 is supported by the first resin section 96. This enables the force applied to the bonding surface 35 in the direction toward the outside of the region 90 to be reduced by the first resin section 96. Therefore, a highly reliable semiconductor device can be provided.

Although only some embodiments of the present invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A semiconductor device, comprising:
    a semiconductor substrate that has an integrated circuit and an electrode;
    a resin layer that is formed on the semiconductor substrate to avoid at least a part of the electrode;
    a land that is provided on the resin layer;
    an interconnect that electrically connects the electrode with the land; and
    an external terminal that is bonded to the land;
    wherein the resin layer includes a first resin section which supports an end section of a bonding surface of the land bonded to the external terminal while avoiding a center section of the bonding surface, and a second resin section adjacent to the first resin section;
    wherein the first resin section has a modulus of elasticity lower than a modulus of elasticity of the second resin section; and
    wherein a side surface of the first resin section is inclined so that an upper surface of the first resin section is larger than a bottom surface of the first resin section.

2. A semiconductor device, comprising:
    a semiconductor substrate that has an integrated circuit and an electrode;
    a resin layer that is formed on the semiconductor substrate to avoid at least a part of the electrode;
    a land that is provided on the resin layer;
    an interconnect that electrically connects the electrode with the land; and
    an external terminal that is bonded to the land;
    wherein the resin layer includes a first resin section which supports an end section of a bonding surface of the land bonded to the external terminal while avoiding a center section of the bonding surface, and a second resin section adjacent to the first resin section;
    wherein the first resin section has a modulus of elasticity lower than a modulus of elasticity of the second resin section; and
    wherein a side surface of the first resin section is inclined so that an upper surface of the first resin section is smaller than a bottom surface of the first resin section.

* * * * *